(12) United States Patent
Kuttner et al.

(10) Patent No.: US 7,982,444 B2
(45) Date of Patent: Jul. 19, 2011

(54) SYSTEMS AND METHODS FOR DRIVING A TRANSISTOR

(75) Inventors: Franz Kuttner, St. Ulrich (AT); Werner Hoellinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 822 days.

(21) Appl. No.: 11/953,639

(22) Filed: Dec. 10, 2007

(65) Prior Publication Data

US 2009/0147542 A1    Jun. 11, 2009

(51) Int. Cl.
*G05F 1/40* (2006.01)

(52) U.S. Cl. ............... 323/274; 323/276; 327/540
(58) Field of Classification Search .......... 327/538–543; 323/273–276
See application file for complete search history.

(56) References Cited

U.S. PATENT DOCUMENTS

| | | | | |
|---|---|---|---|---|
| 6,614,210 | B2* | 9/2003 | Sundaram et al. | 323/354 |
| 6,624,487 | B1* | 9/2003 | Kunz et al. | 257/409 |
| 7,511,549 | B1* | 3/2009 | Luo | 327/307 |
| 2007/0257725 | A1* | 11/2007 | De et al. | 327/379 |

* cited by examiner

*Primary Examiner* — Jessica Han
(74) *Attorney, Agent, or Firm* — Lee & Hayes, PLLC (57) ABSTRACT

This disclosure relates to monitoring and controlling a voltage characteristic of a Drain Extended Metal Oxide Semiconductor (DeMOS) transistor.

18 Claims, 8 Drawing Sheets

SYSTEMS AND METHODS FOR DRIVING A TRANSISTOR

BACKGROUND

DC to DC converters using pulse width modulation enjoy growing popularity due to their low power consumption and easy implementation in digital technologies.

Figure 1:
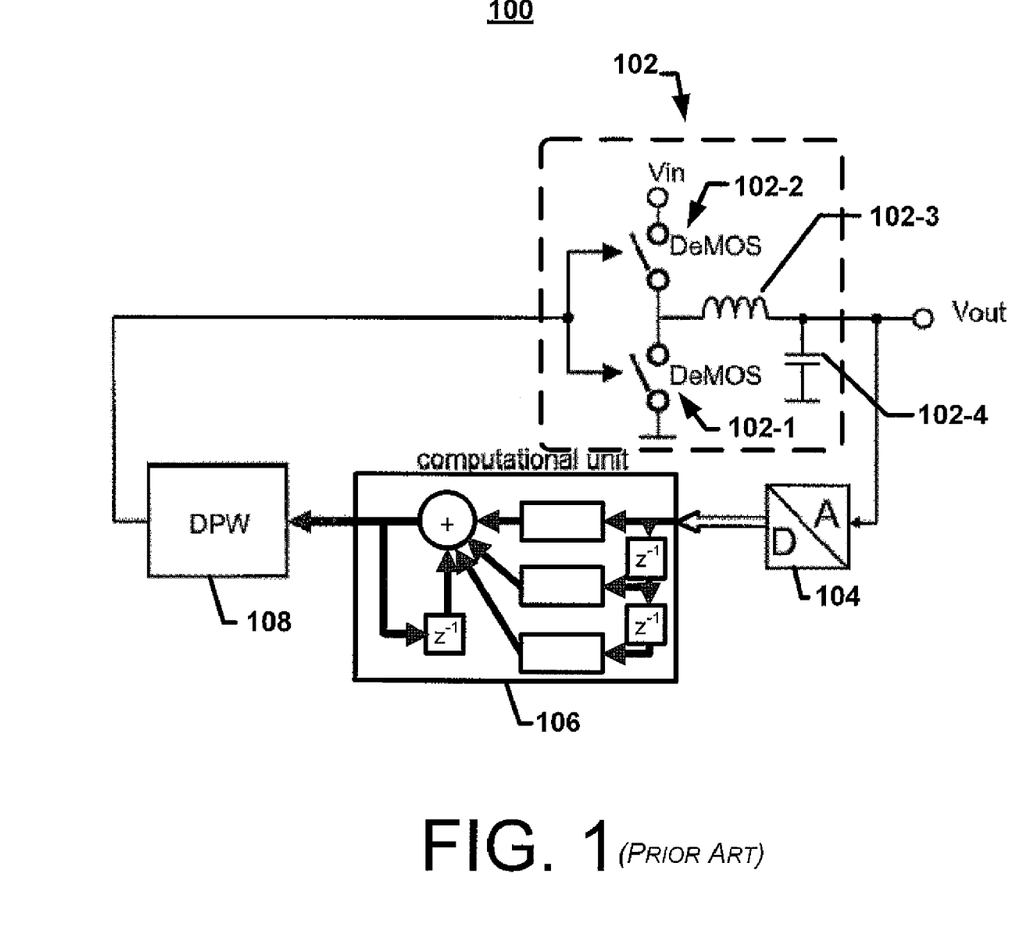
FIG. 1 shows a block diagram of a digitally controlled PWM DC to DC converter system incorporating DeMOS transistors in accordance with the prior art.

FIG. 1 shows a digitally controlled Pulse Width Modulation (PWM) DC to DC converter circuit 100. Generally speaking, PWM converter circuit 100 receives a signal $V_{in}$ and generates a signal $V_{out}$ using the circuitry shown. For example, the converter circuit 100 generally includes a power switching component 102, which may have first and second drain extended metal oxide semiconductor (DeMOS) transistors 102-1 and 102-2, an inductor 102-3, and a capacitor 102-4. DeMOS transistors are particularly useful for DC to DC converters connected direct to a battery source. This is in part due to their generally high output voltage range of, for example 3-6 volts. The circuit 100 may also have a feedback branch that includes an analog to digital (A/D-) converter 104, a digital computational unit 106 and a digital pulse width modulator (DPW) 108.

The A/D-converter 104, the digital computational unit 106, and the DPW 108 may be digital blocks supplied by a so called digital core voltage ($V_{core}$) of 1.0 to 1.5 volts, and may utilize technologies of 130 nm to 22 nm gate lengths. The power switches (DeMOS) 102-1 and 102-2 are typically designed to handle relatively higher voltages. For example, for a DC to DC converter for mobile phones, the supply voltage (Vin) may have the same value as the battery voltage (e.g., up to 6 volts).

In several modern deep sub-micron technologies, DEMOS are required to handle higher voltages. However, to build the DeMOS devices without special process steps, and to build them in a way that the driving capability is as high as possible, these DeMOS devices are generally provided with only a single gate oxide layer. As a result, the voltage from the gate to the channel has to be limited to the core voltage, $V_{core}$, which requires the voltage at the gates of the DeMOS to be limited. In typical power circuit technologies, the voltage level may be limited by one or more devices, such as a Zener diode. However, in deep sub-micron CMOS technologies, Zener diodes or other voltage limiting devices are not available or are not feasible. Nevertheless, the gate-to-source voltages of the power transistors have to be limited.

Another traditional solution to protect the gates of DeMOS devices from an unacceptably high voltage level is to supply the voltage through drivers by auxiliary voltage regulators. As a result of the voltage provided by auxiliary voltage regulator, the driver creates an output signal that is within a safe operating range for the gates of the DeMOS devices. See Forejt, B.; Rentala, V.; Arteaga, J. D.; Burra, G.; *A 700+-mW class D design with direct battery hookup in a 90-nm process*; Solid-State Circuits, IEEE Journal of Volume 40, Issue 9, September 2005, pp. 1880-1887. The proposed solution requires dedicated regulators to supply the driver of DeNMOS (i.e. N-type DeMOS) devices with $V_{core}$ and the driver of DeP-MOS (i.e. P-type DeMOS) devices with a $V_{core}$ below the battery voltage ($V_{batt}$). In the case of driving huge power switches (like in DC-to-DC converters), the regulators have to source huge dynamic current surges, which often can only be provided by huge internal or costly external capacitors.

Yet another traditional solution is to use a level-shifting driver creating an output signal with limited swing in order to drive the DePMOS gate without voltage overstress. See Reed, B.; Ovens, K.; Chen, J.; Mayega, V.; Issa, S.; *A high efficiency ultra-deep sub-micron DCDC converter for microprocessor applications*; Power Semiconductor Devices and ICs, 2004. Proceedings. ISPSD apos; 04. The 16th International Symposium on Volume, Issue, 24-27 May 2004 Page(s): 59-62. This proposed solution has the disadvantage that the clamping device, responsible to limit the voltage swing, continuously needs to be biased resulting in a higher power dissipation. Additionally, the usage of cascode-transistors in the level shifter to limit the voltage swing leads to a huge turn-on and a different turn-off delay time.

Still another solution utilizes a shift capacitor ($C_s$) to move a ground referred signal to the desired potential. The voltage $V_{core}$ driving the capacitance determines the upstroke of the level converted signal. However, the upstroke at the output of the capacitance is decreased by the capacitive voltage divider between $C_s$ and the parasitic capacitance $C_p$. This proposed solution has the disadvantage that the shifted voltage has to be corrected since $C_p$ can become very huge (e.g. in case of driving DC-to-DC power switches). This can be achieved by either adapting the voltage $V_{core}$ to a higher level or by using a very huge shift capacitor $C_s$.

Of the solutions proposed above, one solution needs special technology components, another needs a dedicated new supply voltage, and yet another requires either a huge internal or costly external shift capacitor $C_s$. Furthermore, in a mobile phone system, the driving voltage $V_{core}$ is derived from the battery. Hence it is not an advantage, with respect to the power dissipation of the driver, to control the DeMOS devices with a reduced voltage, i.e., $V_{core} < V_{batt}$.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for monitoring and controlling the voltage at a gate node of a transistor using one or more comparators. In one described implementation, a comparator monitors a gate node of a DeMOS transistor that serves as a power switch. In response to this monitoring, a signal is sent to control logic, which drives a voltage control transistor, such as a voltage control DeMOS transistor, to limit the voltage at the gate of the DeMOS transistor power switch. The sending of the signal may be based on the voltage at the gate node and a reference voltage provided by a reference voltage source.

The techniques described herein may be implemented in a number of ways. Some exemplary environments and contexts are provided below with reference to the included figures and on going discussion.

Exemplary Environment

Figure 2:
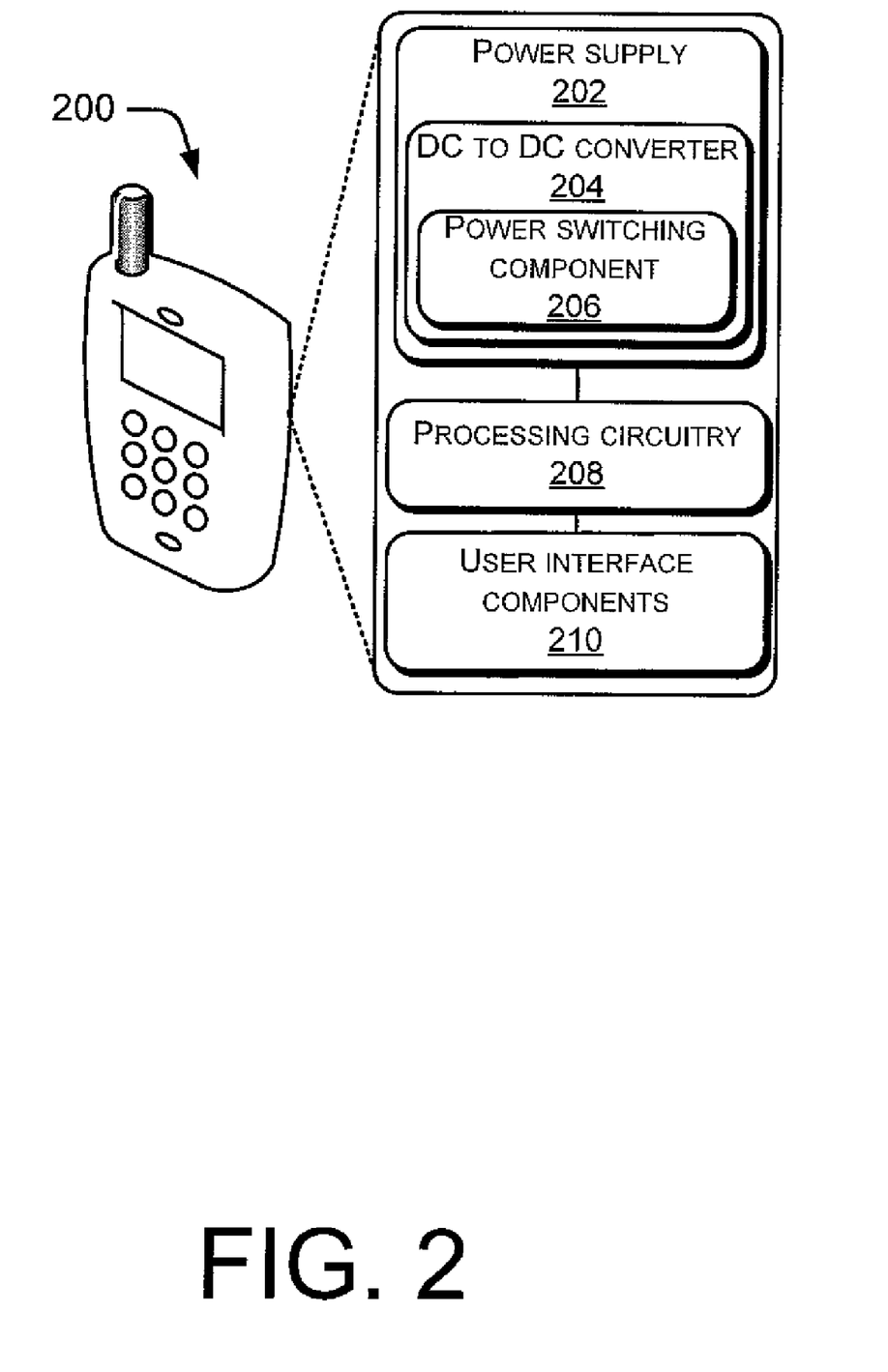
FIG. 2 shows an exemplary environment in which a DC to DC converter may be utilized.

FIG. 2 shows a simplified exemplary implementation of a device 200 that may incorporate a DC to DC converter. For example, device 200 may be a portable device, such as a cell phone, having components including a power supply 202, which may include one or more DC to DC converters 204 in order to convert a voltage level supplied by a power source, such as one or more batteries, to a different level that can be utilized by a circuit or sub-circuit within the device 200. The DC to DC converter 204 may include a power switching component to control the output of the DC to DC converter 204. Device 200 may further include processing circuitry 208 and user interface components 210. The processing circuitry 208 may include an integrated circuit chip and/or other components used in operation of the device. The user interface components 210 may include a display, keypad, and so forth. For the purposes of at least simplicity, further details of the processing circuitry 208 and user interface components 210 are not shown or described.

Exemplary Systems

Figure 3:
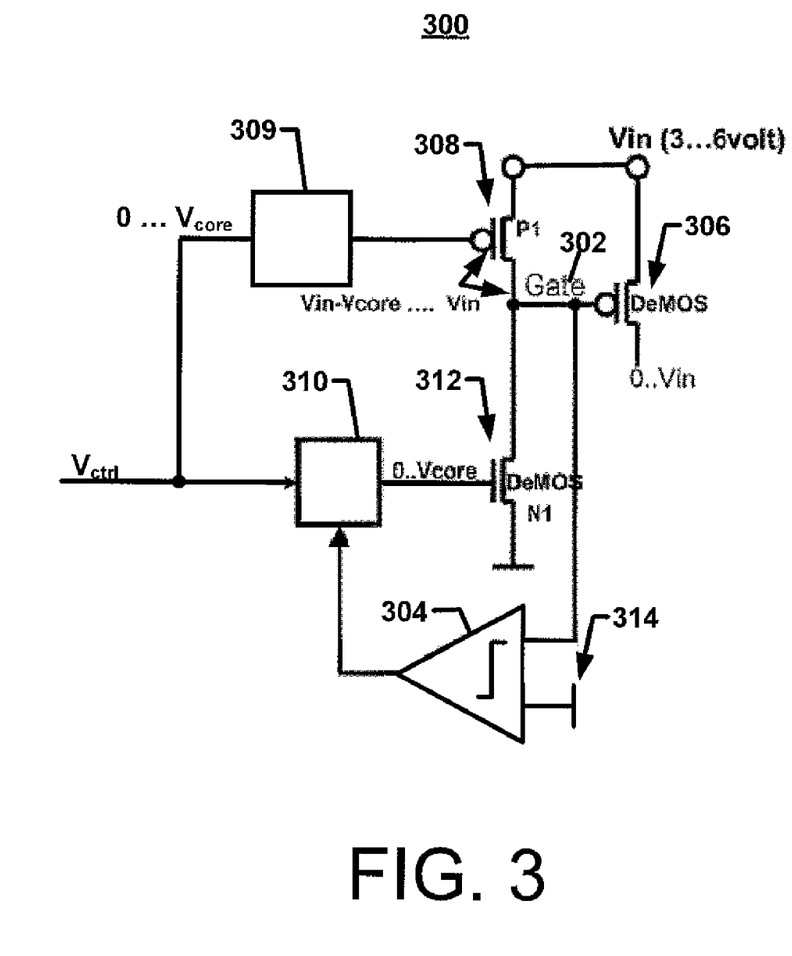
FIG. 3 shows a block diagram of a system for limiting a gate voltage of a transistor by monitoring the voltage at a gate node using one or more comparators.

FIG. 3 shows a first system 300 for limiting a gate voltage of one or more power transistors by monitoring the voltage at the gate node 302 using one or more comparators 304. According to one implementation, P-channel DeMOS transistor 306 may be part of the power switching component 206 in system 200. The voltage at the gate node 302 of the DeMOS transistor 306 can be switched using a single gate oxide P-channel transistor 308, which is also designated as P1, and an N-channel DeMOS 312, which is also designated as N1. DeMOS transistor 306 and P-channel transistor 308 are supplied with an input voltage $V_{in}$, which may be provided from a battery and which may have a value of, for example, 3-6 volts. The gate of the P-channel transistor 308 may be provided with a voltage $V_{ctrl}$ having a level between 0 V and $V_{core}$, which may be provided by or through a level shifter 309. The same voltage $V_{ctrl}$ may be applied to logic 310. According to one implementation, $V_{ctrl}$ and/or $V_{core}$ may be the logic supply voltage that may be used for other components within a device, such as device 200. Thus, N-channel DeMOS 312, which may be considered a voltage control transistor for purposes of discussion, is provided with a voltage value of between 0 and $V_{core}$. The voltage $V_{core}$ may be selected to yield a voltage that is acceptably low for use with the MOS transistor 308 and other voltage sensitive devices.

According to the implementation shown in FIG. 3, the voltage level at gate node 302 is in the range of ($V_{in}$-$V_{core}$) and $V_{in}$. This voltage at gate node 302 is monitored by the comparator 304. Comparator 304 provides a signal to logic 310 that controls the gate of N-channel DeMOS 312. In some implementations, the signal corresponds to a comparison between the voltage at gate node 302 and a reference voltage provided by a reference voltage source 314. The logic 310 thereby controls the gate voltage of N-channel DeMOS 312, which, in turn, controls the voltage level at the gate node 302 of P-channel DeMOS transistor 306.

The gate area, and therefore the gate capacity, of the DeMOS transistor 306 may be large in order to achieve the desired driver capability. The large gate area of the DeMOS transistor 306 leads to relatively slow voltage swings at the gate node 302. The comparator 304 monitors this voltage swing, or the absolute voltage, at the gate node 302 and switches the DeMOS transistor 312 accordingly when a threshold level is reached, so as to regulate the voltage at the gate node 302. The threshold level may be $V_{in}$, ($V_{in}$-$V_{core}$), $V_{core}$, or other like voltage level if the actual, or absolute, voltage level is monitored. A threshold level may be, for example, $V_{core}$, if the voltage swing is monitored.

The comparator 304 is designed to be sufficiently fast to monitor the gate voltage occurring at the gate node 302. For example, the comparator 304 may be provided with a single gate oxide layer. Due to the gate capacitance of the DeMOS transistor 306, the voltage at the gate node 302 remains at the threshold level, and therefore the DeMOS 306 stays in conductive behavior, until it is switched off by transistor 308. For example, P-channel transistor 308 may provide a generally positive bias to the gate node 302, while the transistor 312 is used to pull the bias down toward ground potential in order to control the voltage at the gate node 302. The voltage $V_{ctrl}$ switches the P-channel DeMOS transistor 306 on and off. $V_{ctrl}$ is shifted from a level between zero and $V_{core}$, as shown at the input of the level shifter 309, up to a level between ($V_{in}$-$V_{core}$) and $V_{in}$, as shown at output of the level shifter 309, in order to control transistor 308. The N-channel DeMOS transistor 312 turns on the P-channel DeMOS transistor 306. The P-channel transistor 308 turns off the P-channel DeMOS transistor 306. If $V_{ctrl}$ is zero, N-channel DeMOS transistor 312 is off, the P-channel transistor 308 is on, and, therefore, P-channel DeMOS transistor 306 is off. In order to turn on P-channel DeMOS transistor 306, $V_{ctrl}$ has to have a voltage level of $V_{core}$. Transistor 308 is turned off through the level shifter 309, N-channel DeMOS transistor 312 is turned on by the logic and the gate node 302 is discharged until a threshold level, e.g., ($V_{in}$-$V_{core}$) is reached. The comparator 304 detects this threshold level, turns off N-channel DeMOS transistor 312 via the logic 310. The gate node 302 of P-channel DeMOS transistor 306 holds its voltage level unless P-channel DeMOS transistor 306 it is not switched off again by turning on P-channel transistor 308.

Figure 4:
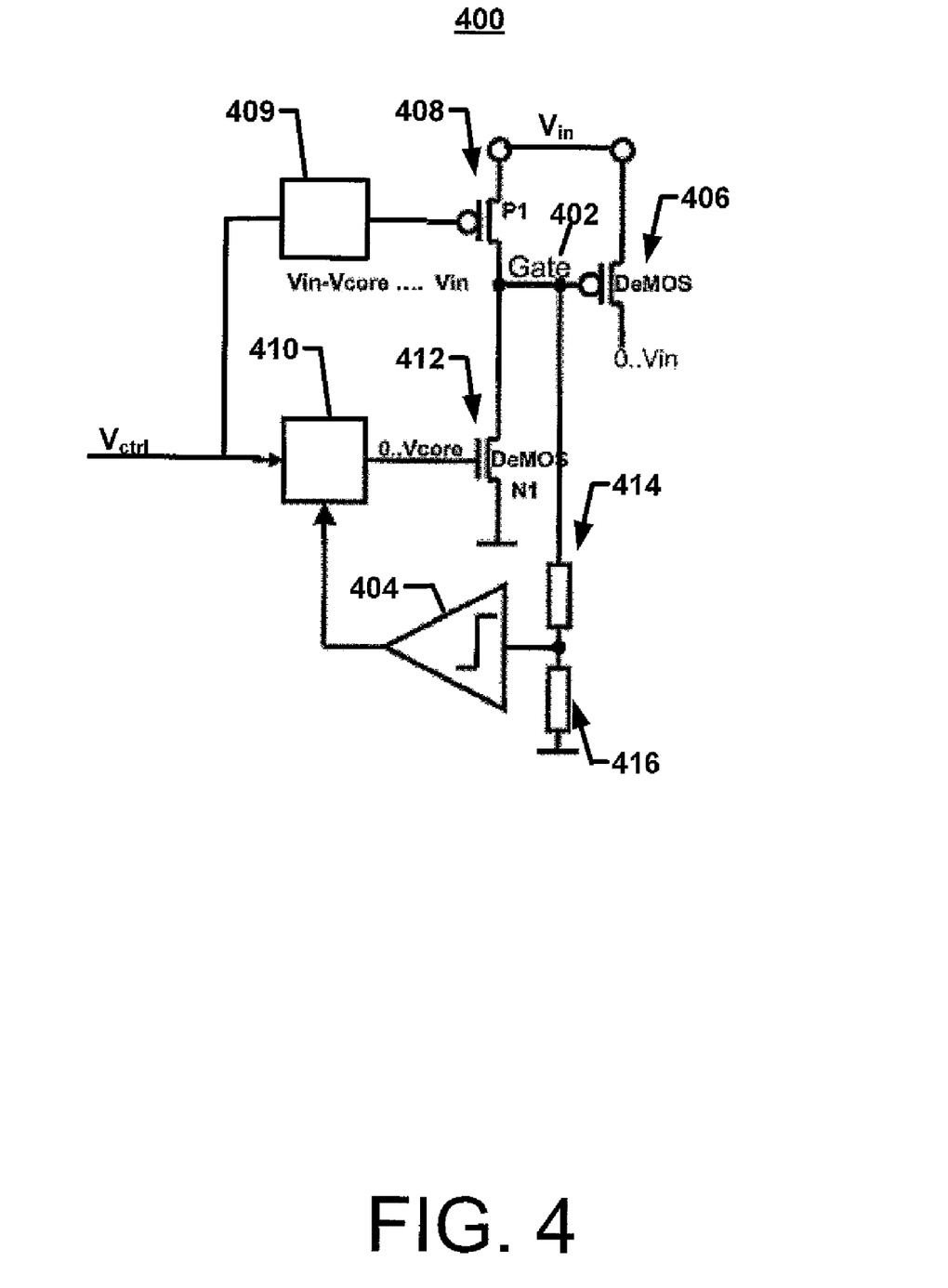
FIG. 4 shows a block diagram of a system for limiting a gate voltage of a transistor by monitoring the voltage at a gate node using one or more comparators, the system having a resistive voltage divider to reduce the voltage monitored by the comparator.

FIG. 4 shows a system 400 having similar components to those in system 300, e.g., a gate node 402, one or more comparators 404, a P-channel DeMOS transistor 406, a P-channel transistor 408, a level shifter 409, logic 410, and an N-channel DeMOS transistor 412, but further incorporates two resistors 414 and 416 configured as a voltage divider to reduce the voltage monitored by the comparator 404. Like comparator 304, comparator 404, or components of comparator 404, may be provided with a single gate oxide in order to be sufficiently fast to monitor the gate voltage occurring at the gate node 402. However, the voltage to be monitored is in the range of ($V_{in}$-$V_{core}$) to $V_{in}$, which may typically range from approximately 4 volts to approximately 6 volts. Such a high voltage may damage or destroy the comparator 404. Therefore, a first resistor 414 is coupled to the gate node 402 and a second resistor 416 is connected to a reference, such as ground. This divides the voltage at gate node 402 and reduces it to a desired sensing range.

Figure 5:
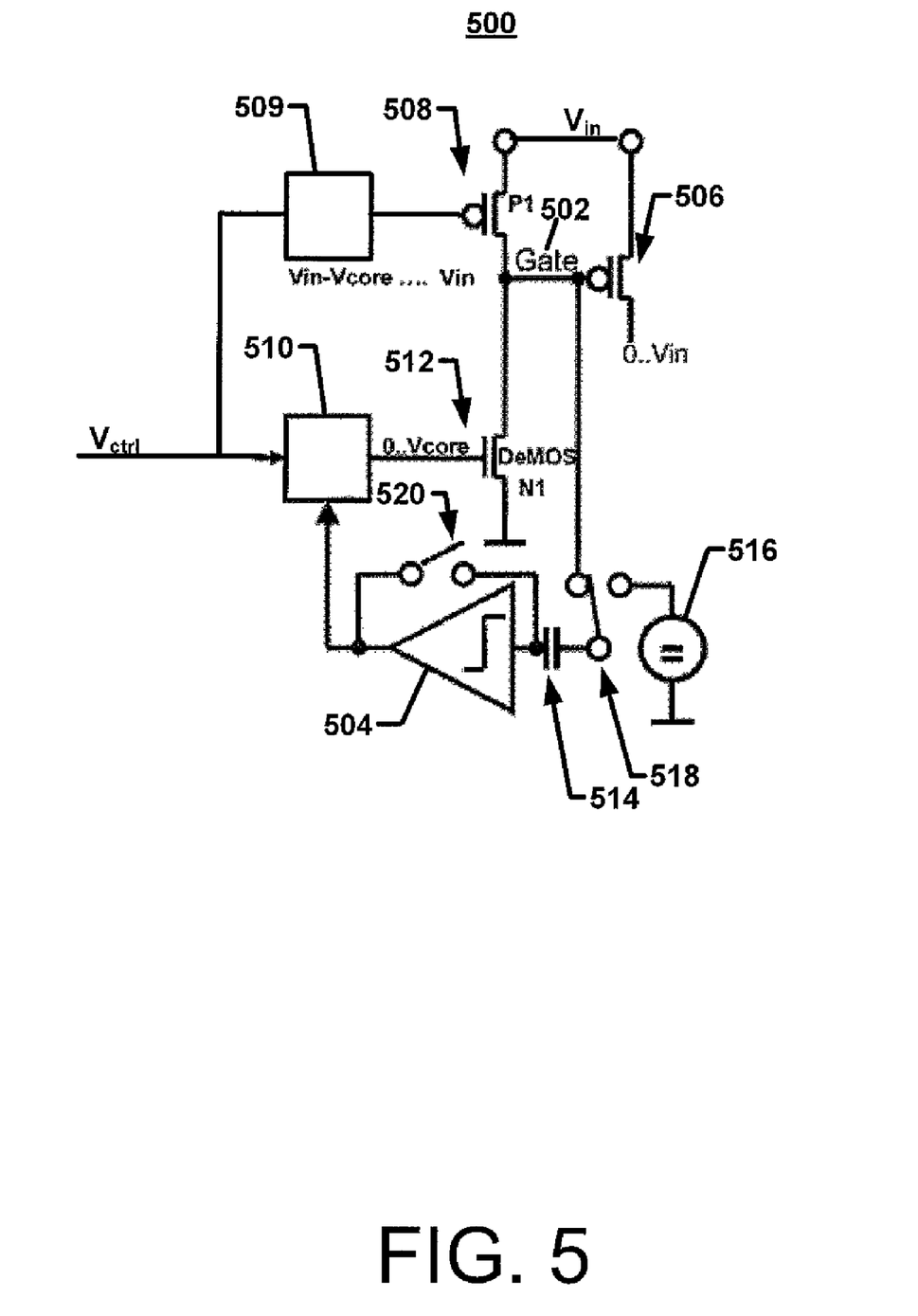
FIG. 5 shows a block diagram of a system for limiting a gate voltage of a transistor by monitoring the voltage at a gate node using one or more comparators, the system having a shift capacitor to reduce the voltage monitored by the comparator.

FIG. 5 shows a system 500 having components similar to those in system 300, e.g. a gate node 502, one or more comparators 504, a P-channel DeMOS transistor 506, a P-channel transistor 508, a level shifter 509, logic 510 and an N-channel DeMOS transistor 512, but further incorporates a capacitive load 514, a reference voltage source 516, and a switch 518, which toggles between receiving the voltage from the gate node 502 and the reference voltage from the reference voltage source 516. An offset compensation switch 520 is coupled to the input and output of comparator 504 in order to offset the voltage value across the comparator 504. Although the offset compensation switch 520 is shown with regard to the system shown in FIG. 5, a similar switch may be implemented with other systems, e.g. systems 300 and 400, and so forth.

According to the implementation shown in FIG. 5, the actual or absolute value of the voltage at the gate 502 is measured. To switch the DeMOS transistor 506 low ohmic, the voltage at the gate node 502 is driven from $V_{in}$, (e.g. $V_{batt}$ of 3 to 6 Volts) to ($V_{in}$-$V_{core}$) (where $V_{core}$ may be, for example, 1.2 volts). The reference voltage, e.g. $V_{core}$, is measured by toggling the switch 518 such that the reference voltage source 516 is coupled to the comparator 504. The switch 518 is then toggled to couple the gate node 502 to the comparator 504. If the voltage at gate 502 jumps by a certain value, for example, 1.2 volts, the comparator 504 detects this jump. The comparator 504 then compares the voltage jump at the gate 502 to the reference voltage 516. Thus, the voltage of gate 502 is discharged (i.e., reduced, or drawn down) until a trigger point, which may be the reference voltage (e.g., $V_{core}$), is reached. Then, the comparator 504, through the logic 510, directs the N-channel DeMOS transistor 512 to switch off, in order to prevent further discharge of the gate node 502 of the DeMOS transistor 506.

Figure 6A:
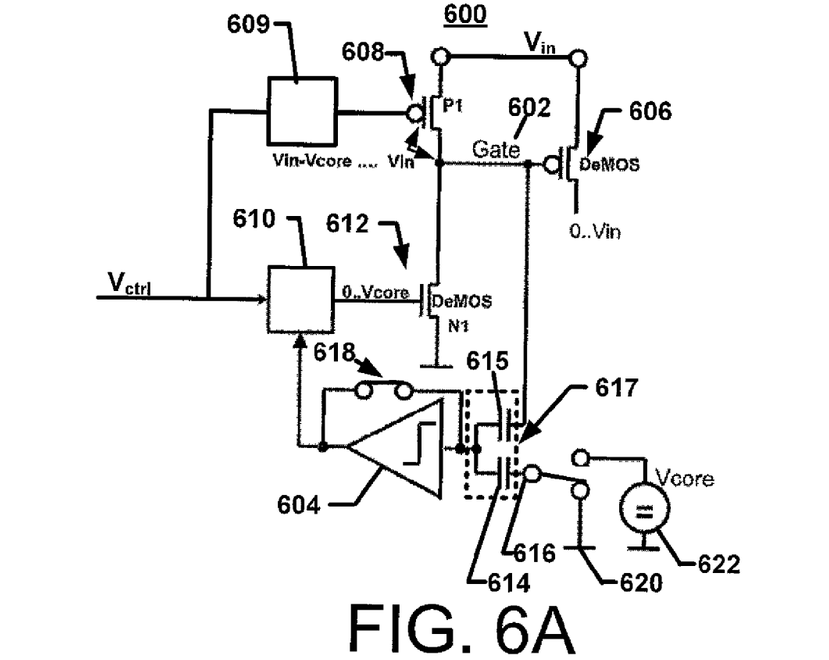
FIG. 6A shows a block diagram of a system with switches in a first position for limiting a gate voltage of a transistor by monitoring the voltage at a gate node using one or more comparators in which a capacitive voltage divider reduces the voltage monitored by the comparator and experienced by switches in the system.
Figure 6B:
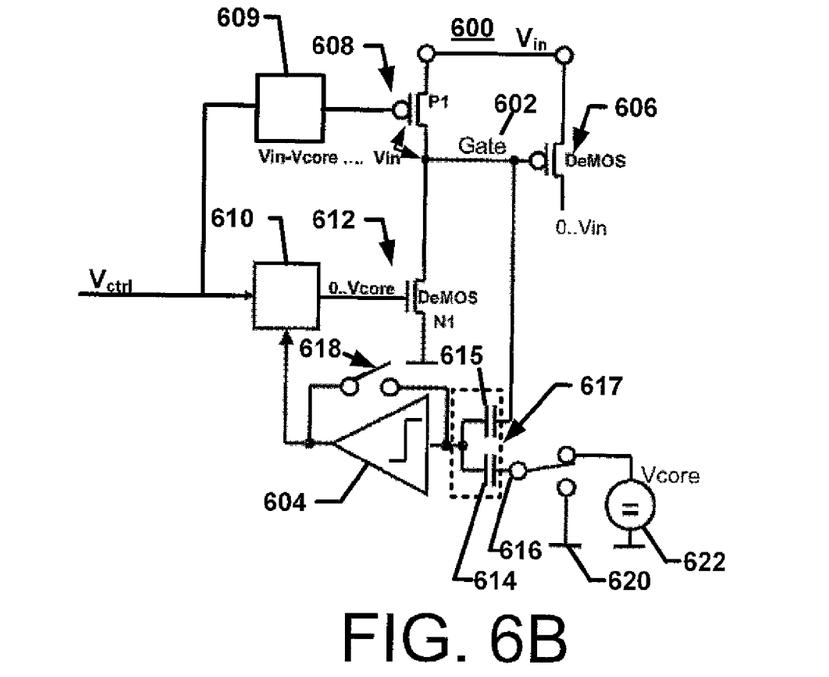
FIG. 6B shows the block diagram of the system shown in FIG. 6A with switches in a second position.

FIGS. 6A and 6B show a system 600 having components similar to those in system 300, e.g., a gate node 602, one or more comparators 604, a DeMOS transistor 606, a P-channel transistor 608, a level shifter 609, logic 610, and an N-channel DeMOS transistor 612, and switches 616, 618 such as those described above with reference to FIG. 5. In system 600, the comparator 604 monitors the voltage swing at the gate node 602 as it changes from Vin to ($V_{in}$-$V_{core}$). Capacitors 614 and 615 operate as a voltage divider 617. Advantageously, each of the components in system 600 can be built with standard CMOS processes. Moreover, each of the switches, (e.g. switches 616, 618, transistor 612, and so forth) can be constructed with a single gate oxide layer because the switches need only handle a voltage level of between 0 and $V_{core}$, e.g., 1.2 volts.

FIG. 6A shows the system 600 in a first mode. Switch 616 is directed to couple a reference or supply voltage to capacitor 614. Switch 618 is closed across the comparator 604. At this point, the DeMOS 612 is switched off, i.e. the node gate 602 is driven by P-channel transistor 608 to a voltage level of $V_{in}$ and the offset of the comparator 604 is compensated by closing switch 618. The output and input of the comparator 604 are at the same potential and an offset value is stored in the input capacitance 614, as is well-known for switched comparators. The comparator 604 is at a decision point and samples the voltage at terminal 622, which may be, for the sake of example, 0 volts or ground. Thus, closing switch 618 not only provides offset compensation, but also teaches (i.e., programs) the comparator its decision level.

FIG. 6B shows the system 600 in a second mode. Switch 618 is opened across the comparator 604. By opening switch 618, the comparator 604 is switched to its amplifying state. The comparator 604 amplifies any changes in the signal input to the comparator 604 as a comparator output.

When switch 616 is directed to couple $V_{core}$ (which according to this example is 1.2 volts) to capacitor 614, the comparator 604 is no longer at its decision level and it is overdriven at its input. The input of the comparator 604 has increased from the decision level to decision level plus $V_{core}/2$ (assuming both capacitors are equally sized). To return the comparator 604 to its decision level, a voltage jump of the same extent (but in the other direction) is applied at capacitive load 615. This is done by charging the gate of DeMOS transistor 612 to $V_{core}$ and, thus, discharging gate node 602 from $V_{in}$ to ($V_{in}$-$V_{core}$). This discharge places P-channel DeMOS transistor 606 into an "on" mode. Once the level ($V_{in}$-$V_{core}$) is reached at node gate 602, the comparator 604 is back in its decision level and will switch from one voltage level to another, thereby directing DeMOS 612 to turn off, which stops the discharge of node gate 602.

Figure 7:
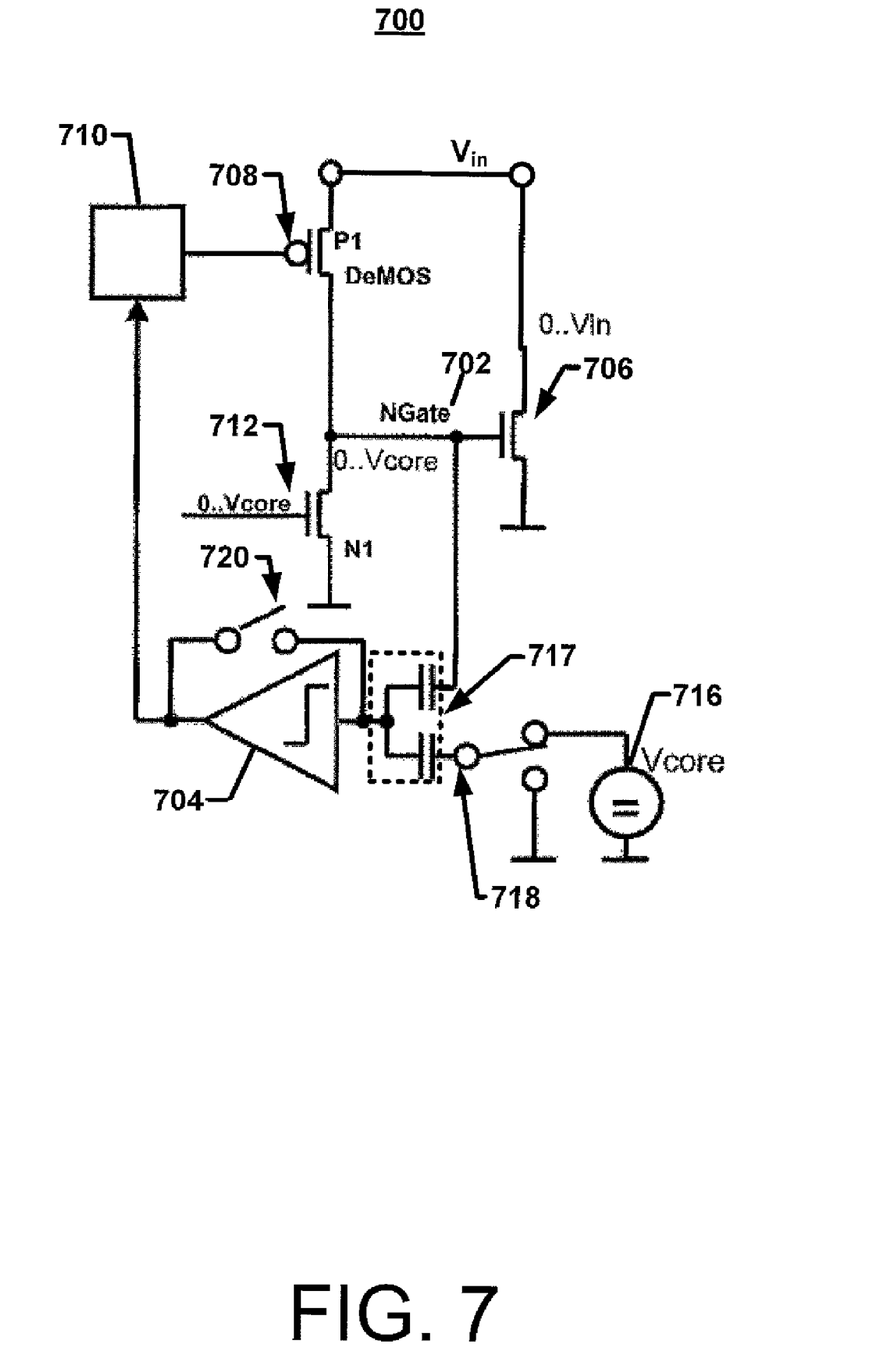
FIG. 7 shows a block diagram of a system for limiting a gate voltage of a transistor by monitoring the voltage at a gate node using one or more comparators in which a divided capacitive load reduces the voltage monitored by the comparator.

FIG. 7 shows a system 700 having an N-type gate node 702. Thus, unlike P-type gate nodes 302, 402 and 502, which are discharged in order to place the gate in an "on" state, the N-type gate node 702 is instead charged in order to place N-channel DeMOS transistor 706 in an "on" state. System 700 also includes one or more comparators 704 for monitoring the gate node 702, a P-channel DeMOS transistor 708, which is controlled by logic 710, an N-channel transistor 712, which is supplied with a voltage of 0-$V_{core}$, and a voltage divider 717 for reducing the magnitude of the signal at the comparator. The comparator 704 determines whether the gate node 702 is charged to $V_{core}$. If the comparator 704 detects this condition, the comparator 704 generates a signal that directs logic 710 to control P-channel DeMOS 708 such to stop the charging of gate node 702.

Because the gate driving level for the N channel DeMOS 712 is in the range from 0 to $V_{core}$, it can be constructed with standard CMOS. However, the gate area of transistor 706 is relatively large; thus, the gate capacitance and therefore the current to drive this gate are also large. Moreover, the supply voltage for this driver has to be low ohmic or stabilized by large capacitance. Therefore, the charge for driving the gate of the N channel DeMOS 706 is obtained directly from the battery, as shown in FIG. 7.

According to the implementations described above, the comparator, e.g., comparator 604, 704 and so forth, may be constructed using an inverter with a feedback offset compensation switch 620. Alternatively, the comparator that is utilized may be any known comparator or switched comparator.

Exemplary Process

An exemplary process for monitoring the voltage in accordance with the present disclosure will now be described. For simplicity, the process will be described with reference to the exemplary environment 100 and the exemplary system 600 described above with reference to FIGS. 1 and 6.

Figure 8:
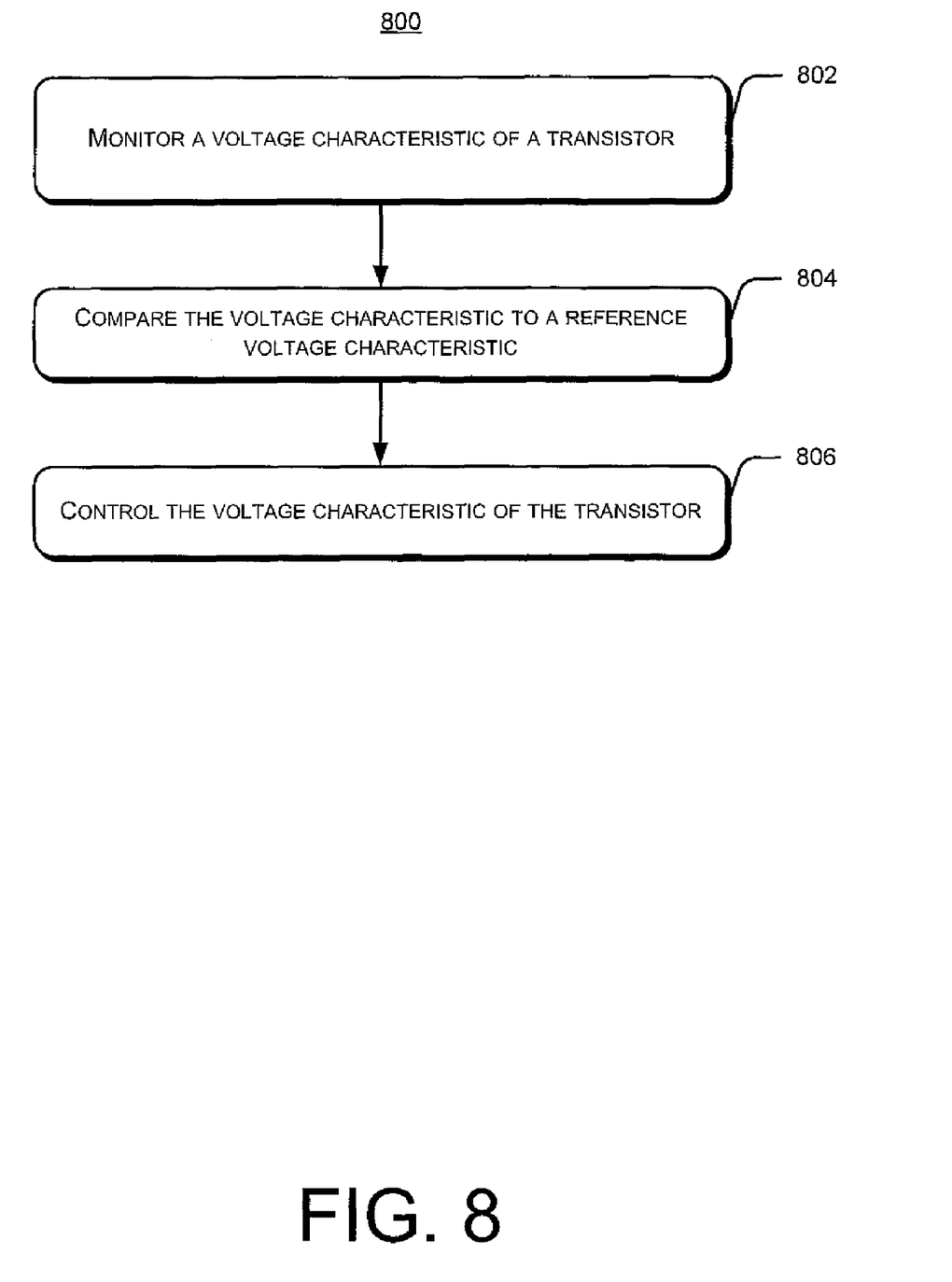
FIG. 8 is a flow diagram of a process for monitoring and controlling a gate voltage characteristic of a transistor.

FIG. 8 shows one example implementation of a process 800 for monitoring the voltage at a DeMOS transistor gate. The process 800 may be implemented within a DC to DC converter 110 or other suitable environment.

At 802, a voltage characteristic of a transistor, such as a DeMOS transistor is monitored. The monitoring may be performed using a comparator, such as comparator 604. The voltage characteristic may include a voltage jump at the gate of the DeMOS, e.g., at gate node 602. The voltage characteristic may also or alternatively include an absolute voltage level and/or a voltage swing. The voltage characteristic may be monitored by directly sensing the voltage characteristic at the gate of the DeMOS. Alternatively, a voltage divider, such as a resistive or capacitive voltage divider, may be implemented to reduce the magnitude of the voltage characteristic prior to the monitoring.

At 804, the voltage characteristic may be compared to a reference voltage characteristic. For example, the absolute voltage level, i.e. the actual voltage value at gate node 602, may be compared to a reference voltage, such as ground, $V_{core}$, or other suitable voltage.

At 806, the voltage characteristic of the transistor is controlled based upon the voltage characteristic that has been monitored and/or compared. For example, if comparator 604 has monitored and compared the voltage at gate 602, the comparator 604 may direct logic and a controlling transistor, e.g. N-channel DeMOS transistor 612, to charge or discharge the gate node 602.

Although specific details of exemplary methods have been described above, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
    a transistor having a source, gate, and drain, the transistor being a P-channel transistor drain extended metal oxide semiconductor (DeMOS); and
    a comparator coupled to the gate of the transistor to monitor a voltage characteristic of the transistor and to control a gate voltage at the gate of the transistor in response to the voltage characteristic, the comparator controls the gate voltage at the gate of the transistor by providing a signal to a logic device, the logic device driving an N-channel DeMOS transistor to control a voltage level at the gate of the transistor.

2. A system as recited in claim 1, wherein the voltage characteristic is an absolute value of the gate voltage that occurs at the gate of the transistor.

3. A system as recited in claim 1, wherein the voltage characteristic is a value representing a voltage swing of the gate voltage of the transistor.

4. A system as recited in claim 1, wherein the drain of the N-channel DeMOS transistor is connected to a source of a P-channel metal oxide semiconductor (MOS) transistor, a battery voltage being provided to the P-channel MOS transistor.

5. A system as recited in claim 4, wherein the voltage level at the gate of the P-channel DeMOS transistor is controlled between the battery voltage and a voltage level of the battery voltage minus a core voltage.

6. A system as recited in claim 1, further comprising a resistive load coupled to the gate of the transistor and to an input of the comparator.

7. A system as recited in claim 6, wherein the resistive load comprises a first resistor coupled to the gate of the transistor and to the input of the comparator and a second resistor coupled to the input of the comparator and to a ground, the first and second resistors operating as a resistive voltage divider.

8. A system as recited in claim 1, further comprising a capacitive load coupled to the gate of the transistor and to a switch, the switch for toggling between the voltage at the gate of the transistor gate and a core voltage.

9. A system as recited in claim 1, further comprising a capacitive voltage divider, the capacitive voltage divider comprising:
    a first capacitor coupled to the gate of the transistor and to the comparator; and
    a second capacitor coupled to the comparator and to a switch, the switch for toggling between a ground and a core voltage.

10. A system as recited in claim 9, wherein the switch is a low voltage switch.

11. A device comprising:
    a comparator to monitor a gate voltage characteristic of a transistor and to control the transistor based on the monitoring, the transistor being an N-channel transistor drain extended metal oxide semiconductor (DeMOS) transistor, and the comparator controls the voltage at the gate of the transistor by providing a signal to a logic device, the logic device driving a P-channel DeMOS transistor to control a voltage level at a gate of the transistor; and
    a voltage divider coupled to an input of the comparator, the voltage divider to reduce the gate voltage characteristic input into the comparator, the voltage divider having a first input coupled to a switch to switch between a ground and a core voltage and a second input coupled to the gate of the transistor.

12. A device as recited in claim 11, further comprising an offset switch coupled to the comparator, the offset switch configured to provide offset compensation and to program a decision level of the comparator.

13. A method comprising:
    monitoring a voltage characteristic of a gate of a drain extended metal oxide semiconductor (DeMOS) transistor, the monitoring includes monitoring a voltage jump across a capacitor that is coupled to the gate of the DeMOS transistor and coupled to a comparator; and
    controlling the voltage characteristic of the DeMOS transistor based on the monitoring.

14. A method as recited in claim 13, wherein the voltage characteristic comprises a value of a voltage swing that occurs at the gate of the DeMOS transistor.

15. A method as recited in claim 13, wherein the voltage characteristic comprises an absolute voltage level that occurs at the gate of the DeMOS transistor.

16. A method as recited in claim 13, wherein controlling the voltage characteristic of the DeMOS transistor comprises limiting a gate voltage of the DeMOS transistor.

17. A method as recited in claim 13, further comprising comparing the monitored voltage characteristic to a reference voltage characteristic, wherein the controlling is based on the comparison of the monitored voltage characteristic to the reference voltage characteristic.

18. A portable electronic device comprising
a direct current (DC) to DC converter, the DC to DC converter including:
   a power switching component to control the output of the DC to DC converter, the power switching component comprising a first drain extended metal oxide semiconductor (DeMOS) transistor, and
   a voltage characteristic monitor to monitor a voltage characteristic of the switching component and to control the voltage characteristic of the switching component based on the monitoring, the voltage characteristic monitor comprising a comparator coupled to a gate of the first DeMOS transistor to monitor a voltage characteristic of the first DeMOS transistor and to control a gate voltage at the gate of the first DeMOS transistor in response to the monitored voltage characteristic, the comparator controls the gate voltage at the gate of the first DeMOS transistor by providing a signal to a logic device, the logic device driving a second DeMOS transistor to control a voltage level at the gate of the first DeMOS transistor;
processing circuitry; and
a user interface component.

* * * * *